(12) United States Patent
Kim

(10) Patent No.: US 10,651,826 B2
(45) Date of Patent: May 12, 2020

(54) SEMICONDUCTOR DEVICE INCLUDING MONITORING CIRCUIT

(71) Applicant: SK hynix Inc., Gyeonggi-do (KR)

(72) Inventor: Young-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/029,983

(22) Filed: Jul. 9, 2018

(65) Prior Publication Data

US 2019/0190499 A1    Jun. 20, 2019

(30) Foreign Application Priority Data

Dec. 20, 2017 (KR) .......................... 10-2017-0176216

(51) Int. Cl.
*H03K 3/011* (2006.01)
*G01R 31/28* (2006.01)
*H03K 3/03* (2006.01)
*H01L 21/66* (2006.01)

(52) U.S. Cl.
CPC ......... *H03K 3/011* (2013.01); *G01R 31/2884* (2013.01); *H01L 22/34* (2013.01); *H03K 3/0315* (2013.01)

(58) Field of Classification Search
CPC ...... H03K 5/134; H03K 3/011; H03K 3/0315; H03K 2005/00052; H03K 2005/00058; H03K 2005/00084; H03K 2005/00019; H03K 2005/00195; H01L 22/34
See application file for complete search history.

(56) References Cited

U.S. PATENT DOCUMENTS 6,232,813 B1 * 5/2001 Lee .................. H03K 5/133
327/158

FOREIGN PATENT DOCUMENTS

KR         101477052        12/2014
KR       1020170082956       7/2017

* cited by examiner

*Primary Examiner* — Hai L Nguyen
(74) *Attorney, Agent, or Firm* — IP & T Group LLP

(57) ABSTRACT

A semiconductor device includes a plurality of delay cells coupled in series to each other, each including a pull-up transistor and a pull-down transistor coupled in series to each other; a monitoring control block suitable for controlling the delay cells to perform a monitoring operation based on an enable signal; and a coupling block that is arranged between each input terminal of the delay cells and a gate of the pull-up transistor or pull-down transistor, and suitable for adjusting a turn-on level based on the enable signal.

21 Claims, 7 Drawing Sheets

FIG. 6

| STATE | ROD_EN | PLHN | NCTRL | PCTRL |
|---|---|---|---|---|
| STANDBY | 0 | 0 | 1 | 0 |
| | 0 | 1 | 1 | 0 |
| PMOS MORNITORING | 1 | 0 | 0(ACTIVE) | 0 |
| MMOS MORNITORING | 1 | 1 | 1 | 1(ACTIVE) |

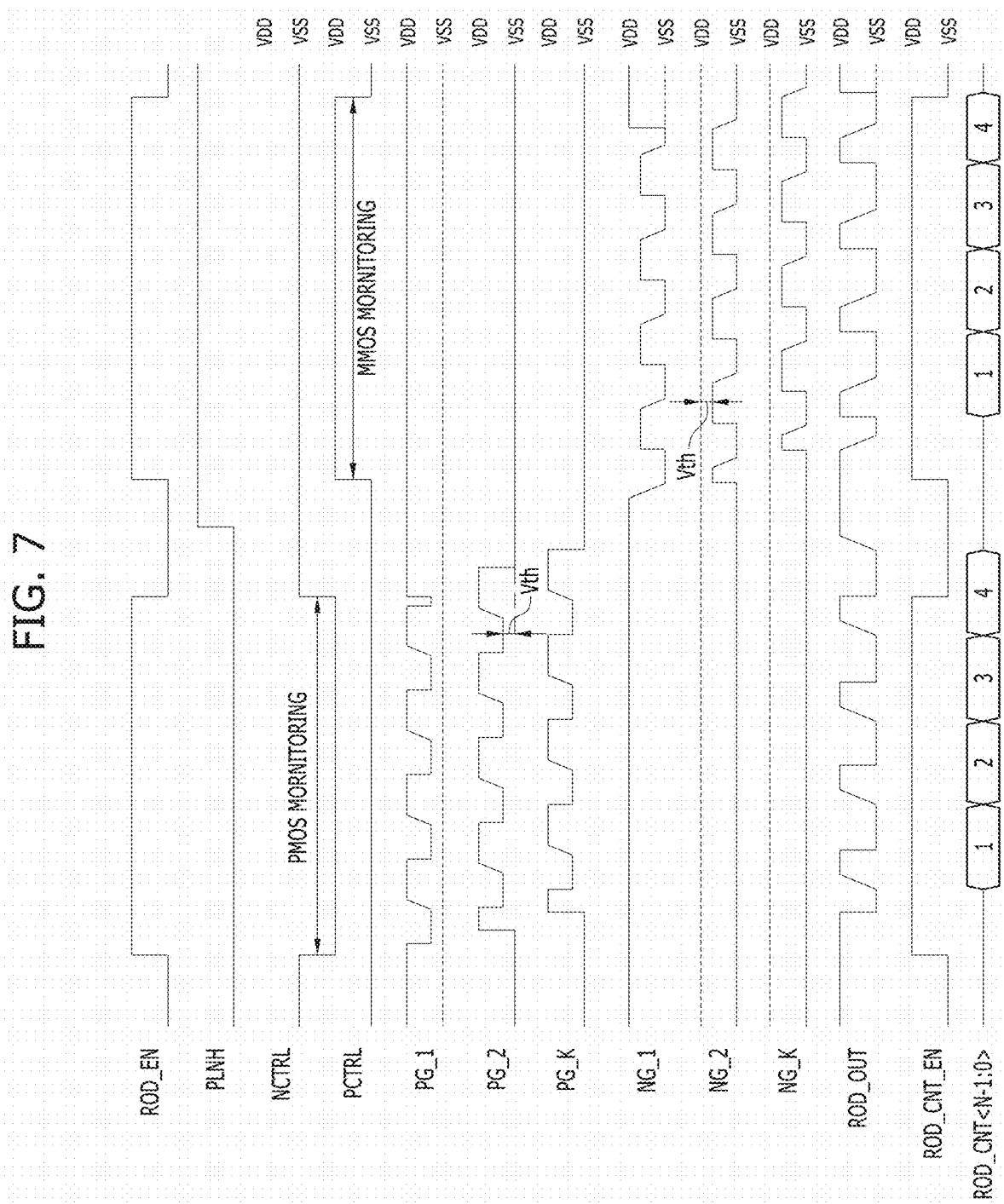

SEMICONDUCTOR DEVICE INCLUDING MONITORING CIRCUIT

CROSS-REFERENCE TO RELATED APPLICATIONS

This application claims priority under 35 U.S.C. § 119 to Korean Patent Application No. 10-2017-0176216, filed on Dec. 20, 2017, the disclosure of which is incorporated herein by reference in its entirety.

BACKGROUND

1. Field

Various exemplary embodiments of the disclosure relate to a semiconductor design technique, and more particularly, to a semiconductor device that performs a monitoring operation based on a plurality of ring oscillator delays (ROD).

2. Description of the Related Art

The characteristics of transistors in a semiconductor device are changed by variation in process, voltage and temperature (PVT). Furthermore, transistors arranged in a semiconductor device may show undesired characteristics due to inconsistencies in gate patterning processes of the respective transistors or differences between doses (ions/$cm^2$) of implantation processes for determining a threshold voltage Vth. This may degrade the performance of a semiconductor product.

Since a semiconductor device requires a reduction in size, a minute difference due to process variation may occur between transistors, which are configured to have the same characteristic in the semiconductor device. Therefore, it is necessary to implement a device capable of checking the characteristics of the transistors arranged in the semiconductor device.

The semiconductor device may include a ring oscillator delay (ROD) having characteristics dependent on PVT variation. The ring oscillator delay (ROD) may measure individual characteristics, for example, an operating speed, of an NMOS transistor and a PMOS transistor to monitor process variations. This may allow the semiconductor device to compensate an operation according to a monitoring result.

SUMMARY

Various embodiments of the present invention are directed to a semiconductor device including a ring oscillator delay (ROD) for accurately monitoring individual characteristics of a PMOS transistor and an NMOS transistor.

In accordance with an embodiment of the present invention, a semiconductor device includes: a plurality of delay cells coupled in series to each other, each including a pull-up transistor and a pull-down transistor coupled in series to each other; a monitoring control block suitable for controlling the delay cells to perform a monitoring operation based on an enable signal; and a coupling block that is arranged between each input terminal of the delay cells and a gate of the pull-up transistor or pull-down transistor, and suitable for adjusting a turn-on level based on the enable signal.

In accordance with an embodiment of the present invention, a semiconductor device includes: a first monitoring block that includes a plurality of first delay cells, which are coupled in series to each other, each including a first pull-up transistor and a first pull-down transistor coupled in series to each other, and suitable for performing a monitoring operation based on a first enable signal; a second monitoring block that includes a plurality of second delay cells, which are coupled in series to each other, each including a second pull-up transistor and a second pull-down transistor coupled in series to each other, and suitable for performing a monitoring operation based on a second enable signal; a first coupling block that is arranged between each input terminal of the first delay cells and a gate of the first pull-up transistor, and suitable for adjusting a turn-on level based on the first enable signal; and a second coupling block that is arranged between each input terminal of the second delay cells and a gate of the second pull-down transistor, and suitable for adjusting a turn-on level based on the second enable signal.

In accordance with an embodiment of the present invention, a semiconductor device includes: a monitoring block that includes a plurality of delay cells, which are coupled in series to each other, each including a pull-up transistor and a pull-down transistor coupled in series to each other, and suitable for performing a monitoring operation based on an enable signal; a first coupling block that is arranged between each input terminal of the delay cells and a gate of the pull-up transistor, and suitable for adjusting a turn-on level based on a first control signal; a second coupling block that is arranged between each input terminal of the delay cells and a gate of the pull-down transistor, and suitable for adjusting a turn-on level based on a second control signal; and a control signal generation block suitable for activating the first control signal or the second control signal based on a mode signal when the enable signal is activated, and deactivating the first control signal or the second control signal when the enable signal is deactivated.

In accordance with an embodiment of the present invention, a semiconductor device includes: a plurality of delay cells coupled in series to each other, each including a pull-up transistor and a pull-down transistor coupled in series to each other; a monitoring control block suitable for controlling the delay cells to perform a monitoring operation based on an enable signal; and a coupling block arranged between each input terminal of the delay cells and a gate of the pull-up transistor or pull-down transistor, and suitable for maintaining a turn-on state.

In accordance with an embodiment of the present invention, a semiconductor device includes: a plurality of delay cells that are coupled in series to each other, each including a pull-up transistor and a pull-down transistor; a ring oscillator detector suitable for monitoring characteristics of the pull-up transistor and the pull-down transistor to generate an enable signal; and a controller suitable for manipulating at least one of turn-on levels of the pull-up transistor and the pull-down transistor based on the enable signal.

BRIEF DESCRIPTION OF THE DRAWINGS

FIG. 6 is a truth table for describing an operation of a control signal generation block shown in FIG. 5.

FIG. 7 is a timing diagram illustrating an operation of a semiconductor device shown in FIG. 5.

DETAILED DESCRIPTION

Various embodiments of the present invention will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
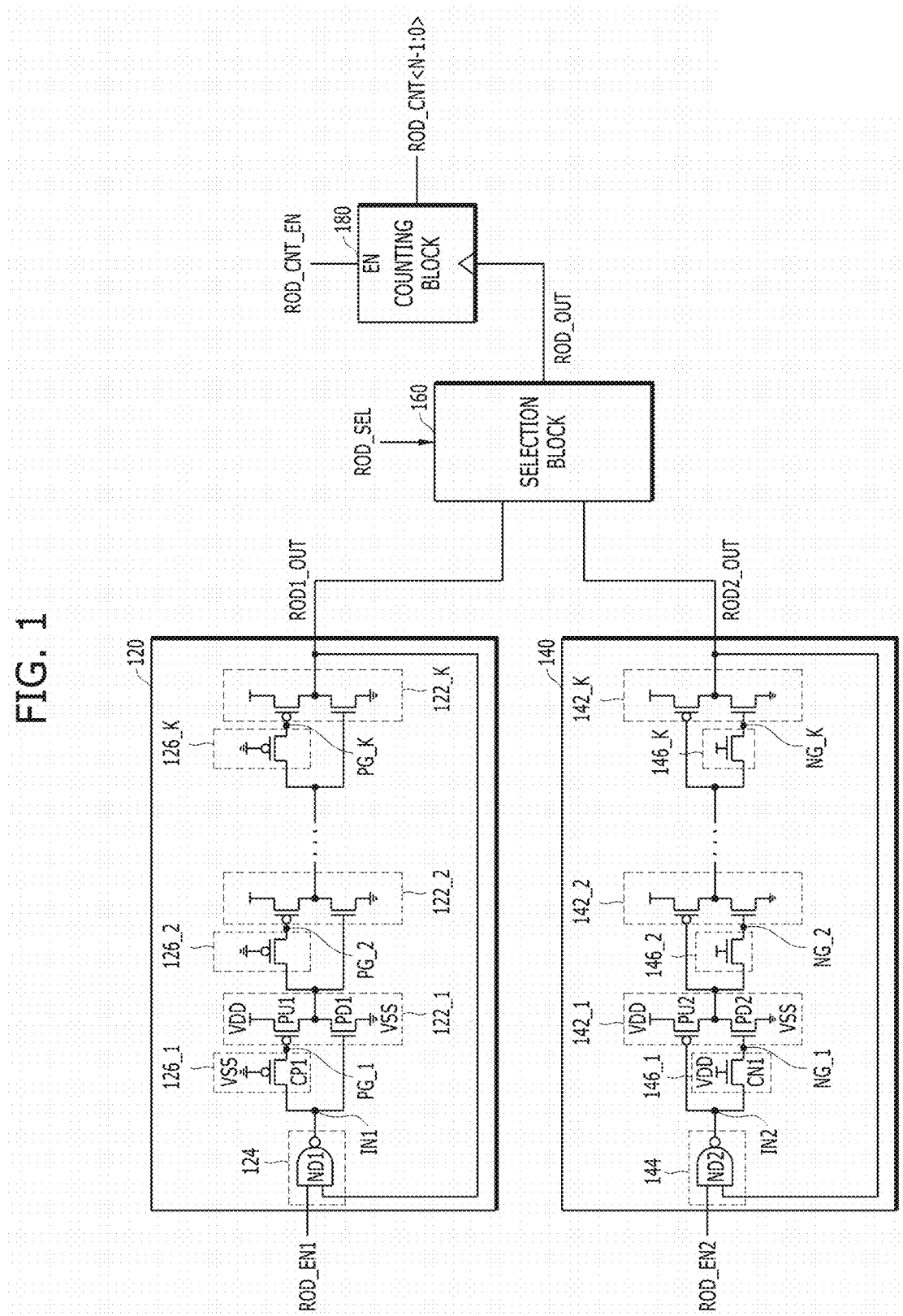
FIG. 1 is a block diagram illustrating a semiconductor device in accordance with a first embodiment of the present invention.

FIG. 1 is a block diagram illustrating a semiconductor device 100 in accordance with a first embodiment of the present invention.

Referring to FIG. 1, the semiconductor device 100 may include a first monitoring block 120, a second monitoring block 140, a selection block 160, and a counting block 180.

The first monitoring block 120 may be embodied in a ring oscillator delay (ROD) for monitoring characteristics of a PMOS transistor. The second monitoring block 140 may be embodied in a ring oscillator delay (ROD) for monitoring characteristics of an NMOS transistor.

The first monitoring block 120 may include a plurality of first delay cells 122_1 to 122_K coupled in series to each other and a first monitoring control unit 124 for controlling the first delay cells 122_1 to 122_K to perform a monitoring operation based on a first enable signal ROD_EN1. The first delay cells 122_1 to 122_K may be composed of an even number, that is, K is an even number. The first delay cells 122_1 to 122_K constitute a delay chain composed of a plurality of inverters. Each of the first delay cells 122_1 to 122_K may include a pull-up transistor PU1 and a pull-down transistor PD1 that are coupled in series to each other. When the first enable signal ROD_EN1 is activated, the first monitoring control unit 124 may invert an output of the delay cell 122_K disposed at a last terminal among the first delay cells 122_1 to 122_K, that is, a first monitoring signal ROD1_OUT, to provide an inverted first monitoring signal ROD1_OUT to an input terminal IN1 of the delay cell 122_1 disposed at a first terminal. The first monitoring control unit 124 may be composed of a NAND gate ND1 that performs a NAND operation on the first enable signal ROD_EN1 and the first monitoring signal ROD1_OUT.

Besides, the first monitoring block 120 may further include a plurality of pull-up coupling units 126_1 to 126_K which maintain a turn-on state. Each of the pull-up coupling units 126_1 to 126_K is arranged between an input terminal of each of the first delay cells 122_1 to 122_K and a gate of the pull-up transistor PU1. By way of example but not limitation, the first pull-up coupling unit 126_1 may be composed of a PMOS transistor CP1 whose one side is coupled to the input terminal IN1 of the first delay cell 122_1, the other side is coupled to the gate of the pull-up transistor PU1 of the first delay cell 122_1, and gate is coupled to a ground voltage VSS terminal. The first monitoring block 120 may monitor the characteristics of the PMOS transistor by using the pull-up coupling units 126_1 to 126_K, each of which is arranged in front of the gate of the pull-up transistor PU1.

The second monitoring block 140 may include a plurality of second delay cells 142_1 to 142_K coupled in series to each other and a second monitoring control unit 144 for controlling the second delay cells 142_1 to 142_K to perform a monitoring operation based on a second enable signal ROD_EN2. The second delay cells 142_1 to 142_K may be composed of an even number, that is, K is an even number. The second delay cells 142_1 to 142_K constitute a delay chain composed of a plurality of inverters. Each of the second delay cells 142_1 to 142_K may include a pull-up transistor PU2 and a pull-down transistor PD2 that are coupled in series to each other. When the second enable signal ROD_EN2 is activated, the second monitoring control unit 144 may invert an output of the delay cell 142_K disposed at a last terminal among the second delay cells 142_1 to 142_K, that is, a second monitoring signal ROD2_OUT, to provide an inverted second monitoring signal ROD2_OUT to an input terminal IN2 of the delay cell 142_1 disposed at a first terminal. The second monitoring control unit 144 may be composed of a NAND gate ND2 that performs a NAND operation on the second enable signal ROD_EN2 and the second monitoring signal ROD2_OUT.

Besides, the second monitoring block 140 may further include a plurality of pull-down coupling units 146_1 to 146_K which maintain a turn-on state. Each of the pull-down coupling units 146_1 to 146_K is arranged between an input terminal of each of the second delay cells 142_1 to 142_K and a gate of the pull-down transistor PD2. By way of example but not limitation, the first pull-down coupling unit 146_1 may be composed of an NMOS transistor CN1 whose one side is coupled to the input terminal IN2 of the second delay cell 142_1, the other side is coupled to a gate of the pull-up transistor PU2 of the second delay cell 142_1, and gate is coupled to a power source voltage VDD terminal. The second monitoring block 140 may monitor the characteristics of the NMOS transistor by using the pull-down coupling units 146_1 to 146_K, each of which is arranged in front of the gate of the pull-down transistor PD2.

By way of example but not limitation, FIG. 1 illustrates that the first monitoring block 120 includes the pull-up coupling units 126_1 to 126_K, and the second monitoring block 140 includes the pull-down coupling units 146_1 to 146_K. In other words, the pull-up coupling units 126_1 to 126_K may be configured separately from the first monitoring block 120, and the pull-down coupling units 146_1 to 146_K may be configured separately from the second monitoring block 140.

The selection block 160 may select the first monitoring signal ROD1_OUT or the second monitoring signal ROD2_OUT in response to a selection signal ROD_SEL. The selection block 160 may output a selected signal as a final monitoring signal ROD_OUT. The selection signal ROD_SEL may have a logic low level when the first enable signal ROD_EN1 is activated, and the selection signal ROD_SEL may have a logic high level when the second enable signal ROD_EN2 is activated.

The counting block 180 may count a toggling number of the final monitoring signal ROD_OUT based on a counting enable signal ROD_CNT_EN. The counting block 180 may output a counted toggling number as counting signals ROD_CNT<N−1:0>. The counting enable signal ROD_CNT_EN may be activated when either the first enable signal ROD_EN1 or the second enable signal ROD_EN2 is activated. The counting block 180 may be reset a predetermined time after the counting enable signal ROD_CNT_EN is deactivated.

Although not illustrated, the semiconductor device 100 may further include a decoder that receives mode set signals from a mode register set (MRS) or a test mode register set (TMRS) and decodes the mode set signals to generate the first enable signal ROD_EN1 and the second enable signal ROD_EN2.

In FIG. 1, the reference symbols "PG_1", "PG_2", and "PG_K" denote nodes between the pull-up coupling units 126_1 to 126_K and the first delay cells 122_1 to 122_K. The reference symbols "NG_1", "NG_2", and "NG_K" denote nodes between the pull-down coupling units 146_1 to 146_K and the second delay cells 142_1 to 142_K.

Hereinafter, a monitoring operation of the semiconductor device 100 shown in FIG. 1 will be described with reference to FIG. 2.

Figure 2:
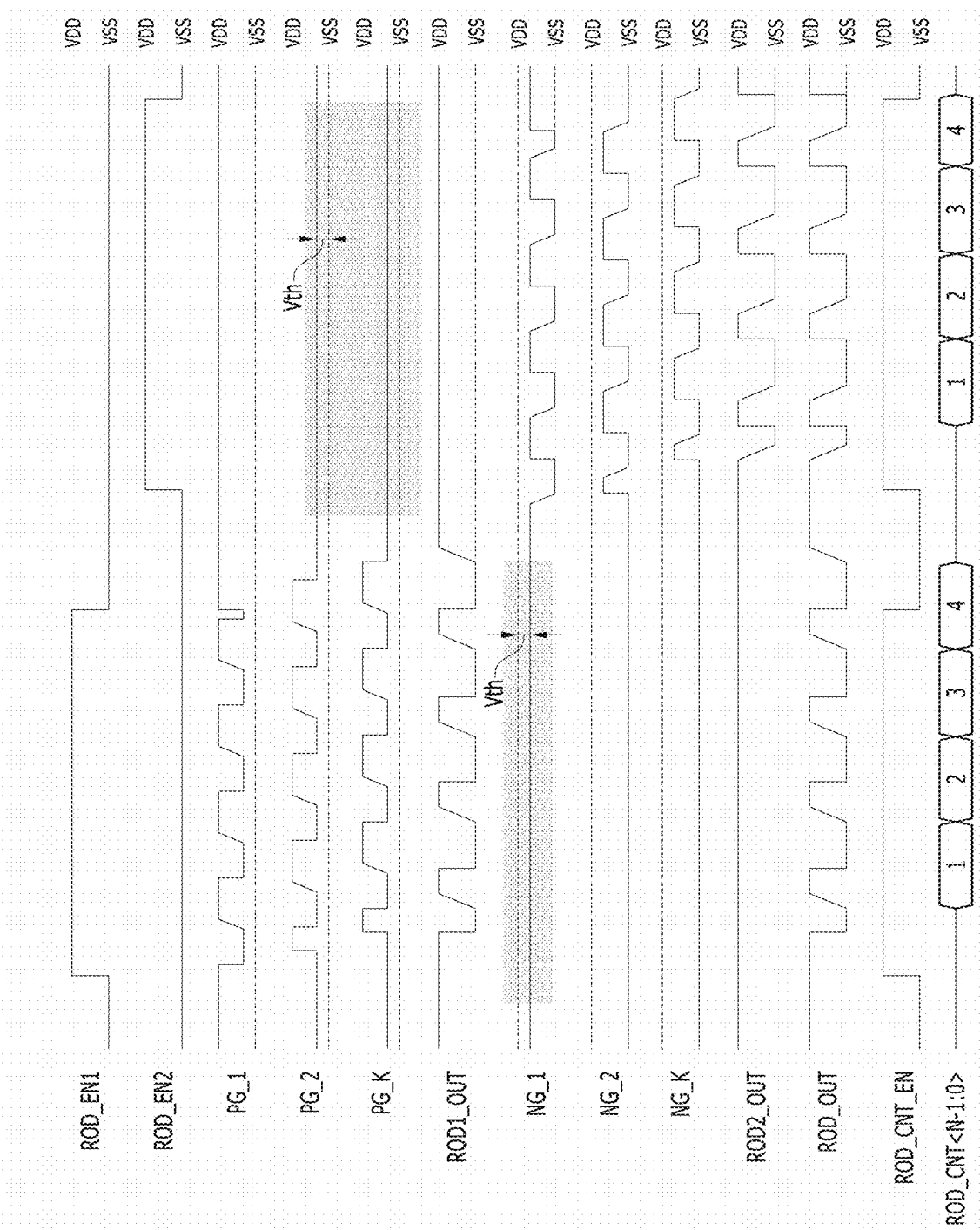
FIG. 2 is a timing diagram illustrating an operation of a semiconductor device shown in FIG. 1.

FIG. 2 is a timing diagram illustrating an operation of the semiconductor device 100 shown in FIG. 1.

Referring to FIG. 2, in a standby mode where the first enable signal ROD_EN1 is deactivated to a logic low level, the first monitoring control unit 124 inputs a signal having a logic high level to the input terminal IN1 of the first delay cell 122_1. Accordingly, the first delay cells 122_1 to 122_K may output the first monitoring signal ROD1_OUT fixed with the logic high level. Similarly, in a standby mode where the second enable signal ROD_EN2 is deactivated to the logic low level, the second delay cells 142_1 to 142_K may output the second monitoring signal ROD2_OUT fixed with the logic high level.

When the first enable signal ROD_EN1 is activated to the logic high level, the first monitoring control unit 124 inverts the first monitoring signal ROD1_OUT to output an inverted signal to the input terminal IN1 of the first delay cell 122_1. The first delay cells 122_1 to 122_K may perform a ring oscillation operation to generate the first monitoring signal ROD1_OUT oscillating at a frequency determined by a process condition P, an operating voltage V and an operating temperature T of the semiconductor device. At this time, strength of the pull-up transistor PU1 of each of the first delay cells 122_1 to 122_K is reduced due to the pull-up coupling units 126_1 to 126_K. Accordingly, a rising edge of the first monitoring signal ROD1_OUT may have a profile having a slope rather than a vertical profile. In other words, the first monitoring block 120 may generate the first monitoring signal ROD1_OUT which is more influenced by characteristics of the pull-up transistor PU1 than the pull-down transistor PD1.

The selection block 160 selects the first monitoring signal ROD1_OUT to output as the final monitoring signal ROD_OUT in response to the selection signal ROD_SEL having the logic low level. The counting block 180 counts the toggling number of the final monitoring signal ROD_OUT to output as the counting signals ROD_CNT<N−1:0> based on the counting enable signal ROD_CNT_EN. The counting signals ROD_CNT<N−1:0> may have a counting value that varies according to the characteristics of the pull-up transistor PU1. An external device, for example, a controller or a test device, may change a size of the PMOS transistor arranged in the semiconductor device by monitoring the counting signals ROD_CNT<N−1:0>. When the counting enable signal ROD_CNT_EN is deactivated, the counting block 180 may reset the counting signals ROD_CNT<N−1:0> after a predetermined time.

Similarly, when the second enable signal ROD_EN2 is activated to the logic high level, the second monitoring control unit 144 inverts the second monitoring signal ROD2_OUT to output an inverted signal to the input terminal IN2 of the second delay cell 142_1. The second delay cells 142_1 to 142_K may perform a ring oscillation operation to generate the second monitoring signal ROD2_OUT oscillating at a frequency determined by a process condition P, an operating voltage V and an operating temperature T of the semiconductor device. At this time, strength of the pull-down transistor PD2 of the second delay cell 142_1 is reduced due to the pull-down coupling units 146_1 to 146_K. Accordingly, a falling edge of the second monitoring signal ROD2_OUT may have a profile having a slope rather than a vertical profile. In other words, the second monitoring block 140 may generate the second monitoring signal ROD2_OUT which is more influenced by characteristics of the pull-down transistor PD2 than the pull-up transistor PU2.

The selection block 160 selects the second monitoring signal ROD2_OUT to output as the final monitoring signal ROD_OUT in response to the selection signal ROD_SEL having the logic high level. The counting block 180 counts the toggling number of the final monitoring signal ROD_OUT to output as the counting signals ROD_CNT<N−1:0> based on the counting enable signal ROD_CNT_EN. The counting signals ROD_CNT<N−1:0> may have a counting value that varies according to the characteristics of the pull-down transistor PD2. The external device may change a characteristic of the NMOS transistor arranged in the semiconductor device by monitoring the counting signals ROD_CNT<N−1:0>.

As described above, the semiconductor device 100 in accordance with the first embodiment of the present invention may monitor process variations by measuring individual characteristics of the NMOS transistor and the PMOS transistor included in the ROD, hence the operation of the semiconductor device according to a monitoring result may be adjusted.

When the first monitoring block 120 does not perform the monitoring operation, that is, in the standby mode where the first enable signal ROD_EN1 is deactivated, the pull-up coupling units 126_1 to 126_K may operate with active resistance. Accordingly, as shown in FIG. 2, the node PG_1 of an odd-numbered terminal maintains the logic high level but the node PG_2 and PG_K of even-numbered terminals maintain an increased level by a threshold value Vth of the PMOS transistor CP1 of the pull-up coupling unit 126_1 at the logic low level (refer to a shaded portion of FIG. 2). Similarly, when the second monitoring block 140 does not perform the monitoring operation, that is, in the standby mode where the second enable signal ROD_EN2 is deactivated, the pull-down coupling units 146_1 to 146_K may operate with active resistance. Accordingly, as shown in FIG. 2, the nodes NG_2 and NG_K of even-numbered terminals maintain the logic low level but the node NG_1 of an odd-numbered terminal maintains a decreased level by the threshold value Vth of the PMOS transistor CP1 of the pull-up coupling unit 126_1 at the logic high level (refer to a shaded portion of FIG. 2).

Therefore, in the standby mode, a leakage current may occur due to the pull-up coupling units 126_1 to 126_K or the pull-down coupling units 146_1 to 146_K. In a second embodiment of the present invention, a circuit capable of minimizing the leakage current of each monitoring block in the standby mode will be described below.

Figure 3:
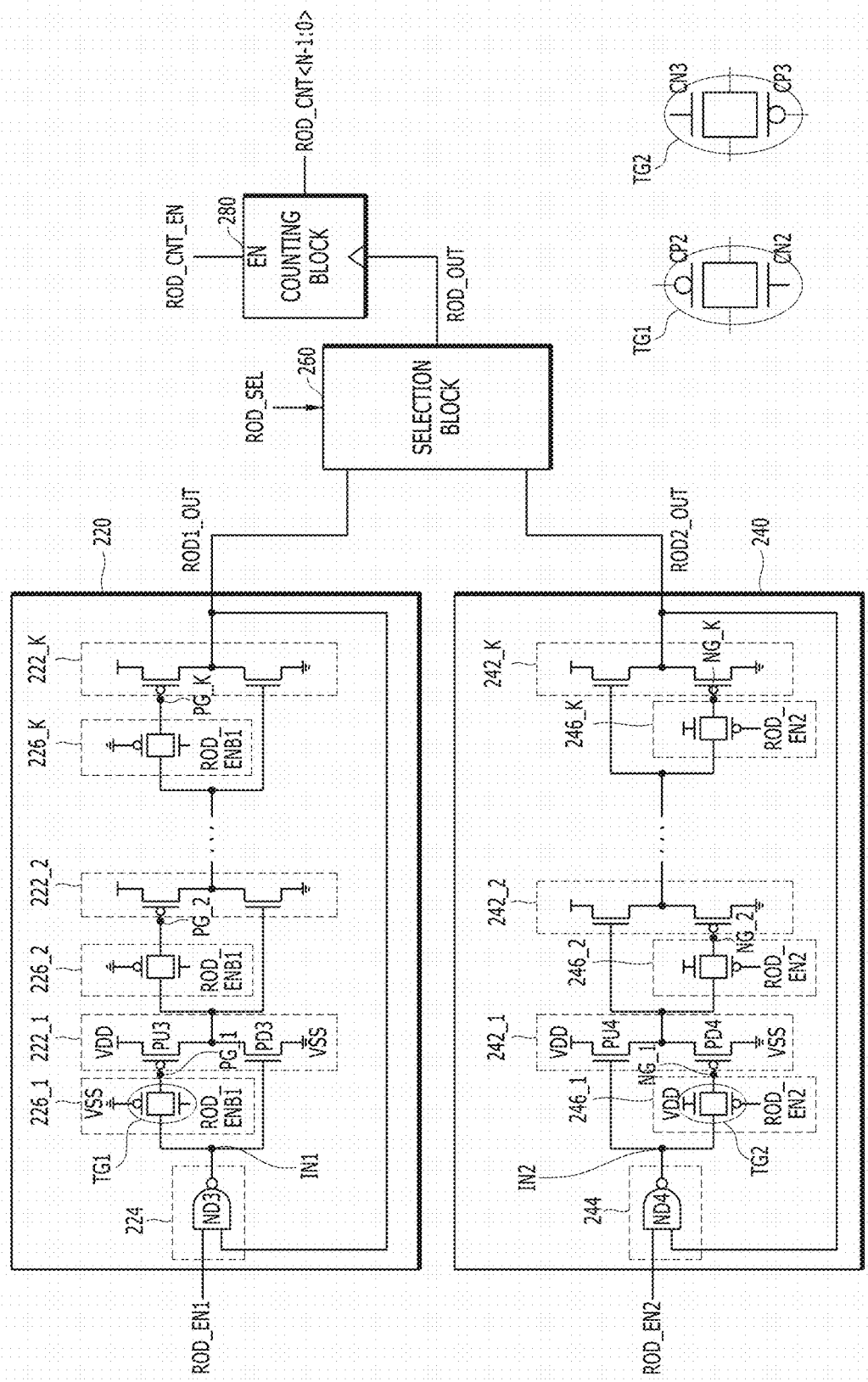
FIG. 3 is a block diagram illustrating a semiconductor device in accordance with a second embodiment of the present invention.

FIG. 3 is a block diagram illustrating a semiconductor device 200 in accordance with a second embodiment of the present invention.

Referring to FIG. 3, the semiconductor device 200 may include a first monitoring block 220, a second monitoring block 240, a selection block 260, and a counting block 280. Since the selection block 260 and counting block 280 shown in FIG. 3 have substantially the same configurations and operations as the selection block 160 and counting block 180 shown in FIG. 1, detailed descriptions thereof are omitted herein.

The first monitoring block 220 may be embodied in a ring oscillator delay (ROD) for monitoring characteristics of a PMOS transistor. The second monitoring block 240 may be embodied in a ring oscillator delay (ROD) for monitoring characteristics of an NMOS transistor.

The first monitoring block 220 may include a plurality of first delay cells 222_1 to 222_K coupled in series to each other and a first monitoring control unit 224 for controlling the first delay cells 222_1 to 222_K to perform a monitoring operation based on a first enable signal ROD_EN1. The first delay cells 222_1 to 222_K may be composed of an even number, that is, K is an even number. The first delay cells 222_1 to 222_K constitute a delay chain composed of a plurality of inverters. Each of the first delay cells 222_1 to 222_K may include a pull-up transistor PU3 and a pull-down transistor PD3 that are coupled in series to each other. When the first enable signal ROD_EN1 is activated, the first monitoring control unit 224 may invert an output of the delay cell 222_K disposed at a last terminal among the first delay cells 222_1 to 222_K, that is, a first monitoring signal ROD1_OUT, to output an inverted first monitoring signal ROD1_OUT onto an input terminal IN1 of the delay cell 222_1 disposed at a first terminal. The first monitoring control unit 224 may be composed of a NAND gate ND3 that performs a NAND operation on the first enable signal ROD_EN1 and the first monitoring signal ROD1_OUT.

Additionally, the first monitoring block 220 may further include a plurality of pull-up coupling units 226_1 to 226_K which adjust turn-on level (or extent) based on the first enable signal ROD_EN1. Each of the pull-up coupling units 226_1 to 226_K is arranged between an input terminal of each of the first delay cells 222_1 to 222_K and a gate of the pull-up transistor PU3. Unlike the pull-up coupling units 126_1 to 126_K shown in FIG. 1, the pull-up coupling units 226_1 to 226_K shown in FIG. 3 may operate to increase more enhanced strength of the pull-up transistor PU3 when the first enable signal ROD_EN1 is deactivated compared to when the first enable signal ROD_EN1 is activated. According to an embodiment, each of the pull-up coupling units 226_1 to 226_K may be composed of a transmission gate TG1, which is fully turned on when the first enable signal ROD_EN1 is deactivated and is slightly turned on when the first enable signal ROD_EN1 is activated. The transmission gate TG1 may include a PMOS transistor CP2 and an NMOS transistor CN2. The PMOS transistor CP2 may have one side coupled to the input terminal IN1 of the first delay cell 222_1, the other side coupled to the gate of the pull-up transistor PU3 of the first delay cell 222_1, and a gate coupled to a ground voltage VSS terminal. The NMOS transistor CN2 may have one side coupled to the input terminal IN1 of the first delay cell 222_1, the other side coupled to the gate of the pull-up transistor PU3 of the first delay cell 222_1, and a gate receiving an inverted signal ROD_ENB1 of the first enable signal ROD_EN1.

The second monitoring block 240 may include a plurality of second delay cells 242_1 to 242_K coupled in series to each other and a second monitoring control unit 244 for controlling the second delay cells 242_1 to 242_K to perform a monitoring operation based on a second enable signal ROD_EN2. The second delay cells 242_1 to 242_K may be composed of an even number, that is, K is an even number. The second delay cells 242_1 to 242_K constitute a delay chain composed of a plurality of inverters. Each of the second delay cells 242_1 to 242_K may include a pull-up transistor PU4 and a pull-down transistor PD4 coupled in series to each other. When the second enable signal ROD_EN2 is activated, the second monitoring control unit 244 may invert an output of the delay cell 242_K disposed at a last terminal among the second delay cells 242_1 to 242_K, that is, a second monitoring signal ROD2_OUT to provide an inverted second monitoring signal ROD2_OUT onto an input terminal IN2 of the delay cell 242_1 disposed at a first terminal. The second monitoring control unit 244 may be composed of a NAND gate ND4 that performs a NAND operation on the second enable signal ROD_EN2 and the second monitoring signal ROD2_OUT.

The second monitoring block 240 may further include a plurality of pull-down coupling units 246_1 to 246_K which adjust turn-on level or turn-on extent. Each of the pull-down coupling units 246_1 to 246_K is arranged between an input terminal of each of the second delay cells 242_1 to 242_K and a gate of the pull-down transistor PD4. Differently from the pull-down coupling units 146_1 to 146_K shown in FIG. 1, the pull-down coupling units 246_1 to 246_K shown in FIG. 3 may operate to further increase strength of the pull-down transistor PD4 when the second enable signal ROD_EN2 is deactivated as compared to when the second enable signal ROD_EN2 is activated. According to an embodiment, each of the pull-down coupling units 246_1 to 246_K may be composed of a transmission gate TG2 which is fully turned on when the second enable signal ROD_EN2 is deactivated and is slightly turned on when the second enable signal ROD_EN2 is activated. The transmission gate TG2 may include an NMOS transistor CN3 and a PMOS transistor CP3. The NMOS transistor CN3 may have one side coupled to the input terminal IN2 of the second delay cell 242_1, the other side coupled to the gate of the pull-down transistor PD4 of the second delay cell 242_1, and a gate coupled to a power source voltage VDD terminal. The PMOS transistor CP3 may have one side coupled to the input terminal IN2 of the second delay cell 242_1, the other side coupled to the gate of the pull-down transistor PD4 of the second delay cell 242_1, and a gate receiving the second enable signal ROD_EN2.

As described above, the first monitoring block 220 may monitor the characteristics of the PMOS transistor by using the plurality of pull-up coupling units 226_1 to 226_K, each of which is arranged in front of the gate of the pull-up transistor PU3. The second monitoring block 240 may monitor the characteristics of the NMOS transistor by using the plurality of pull-down coupling units 246_1 to 246_K, each of which is arranged in front of the gate of the pull-down transistor PD4. In the semiconductor device 200 in accordance with the second embodiment of the present invention, the pull-up coupling units 226_1 to 226_K and the pull-down coupling units 246_1 to 246_K are fully turned on in a standby mode where the first enable signal ROD_EN1 or the second enable signal ROD_EN2 is deactivated. In other words, as an accurately-defined signal having either a logic high level or a logic low level is inputted to the gate of the pull-up transistor PU3 and the gate of the pull-down transistor PD4, a current leaked from the gate of the pull-up transistor PU3 and the gate of the pull-down transistor PD4 may be minimized.

Hereinafter, a monitoring operation of the semiconductor device 200 shown in FIG. 1 will be described with reference to FIG. 4.

Figure 4:
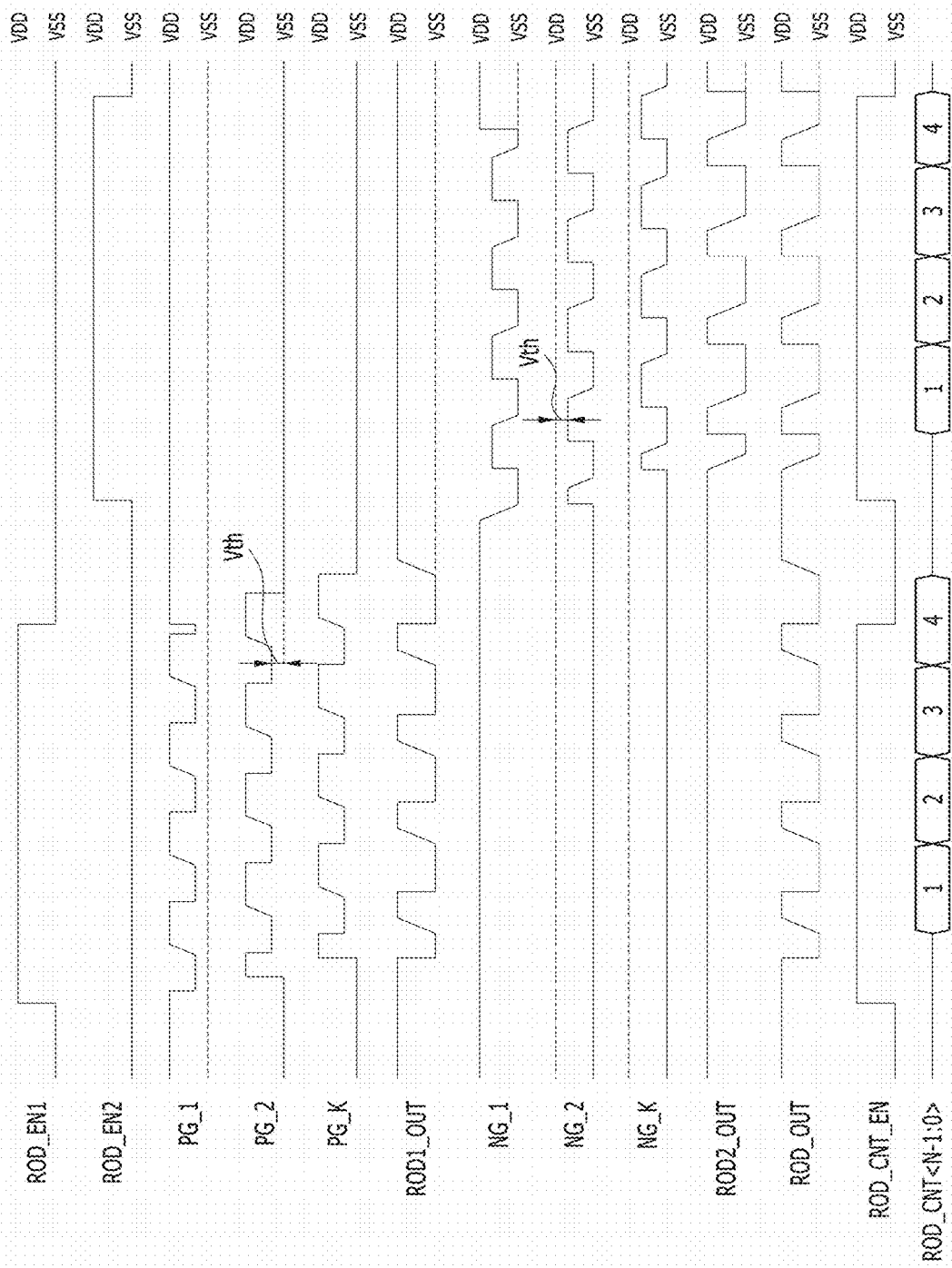
FIG. 4 is a timing diagram illustrating an operation of a semiconductor device shown in FIG. 3.

FIG. 4 is a timing diagram illustrating an operation of the semiconductor device 200 shown in FIG. 3.

Referring to FIG. 4, since a monitoring operation of activating the first enable signal ROD_EN1 to a logic high level and a monitoring operation of activating the second enable signal ROD_EN2 to the logic high level are substantially the same as the monitoring operations shown in FIG. 2, detailed descriptions of the monitoring operations are omitted herein.

In a standby mode where the first enable signal ROD_EN1 is deactivated to a logic low level, the first monitoring control unit 224 may input a signal having the logic high level to the input terminal IN1 of the first delay cell 222_1. The first monitoring control unit 224 may output the first monitoring signal ROD1_OUT fixed with the logic high level. At this time, since the pull-up coupling units 226_1 to 226_K are fully turned on, nodes PG_2 and PG_K of even-numbered terminals maintain the logic low level, differently from what is shown in FIG. 2.

Similarly, in a standby mode where the second enable signal ROD_EN2 is deactivated to the logic low level, the second monitoring control unit 244 may input a signal having the logic high level to the input terminal IN2 of the second delay cell 242_1. Thus, the second delay cells 242_1 to 242_K may output the second monitoring signal ROD2_OUT fixed with the logic high level. At this time, since the pull-down coupling units 246_1 to 246_K are fully turned on, a node NG_1 of an odd-numbered terminal maintains the logic high level, differently from what is shown in FIG. 2.

As described above, the semiconductor device 200 in accordance with the second embodiment of the present invention may minimize the leakage current of each monitoring block in the standby mode.

In an embodiment, a circuit capable of minimizing a mismatch between a monitoring operation on characteristics of a PMOS transistor and a monitoring operation on characteristics of an NMOS transistor will be described below.

Figure 5:
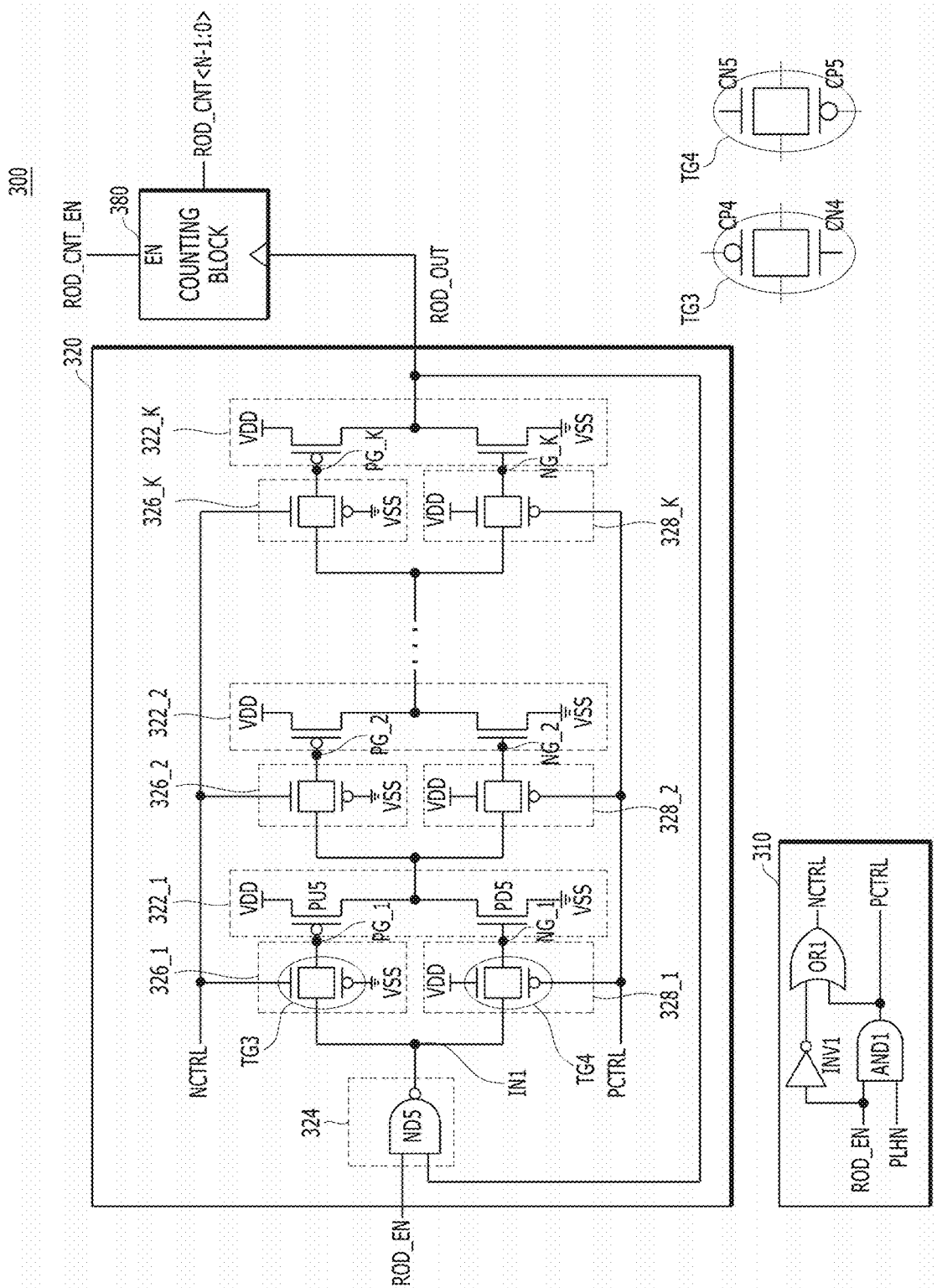
FIG. 5 is a block diagram illustrating a semiconductor device in accordance with a third embodiment of the present invention.

FIG. 5 is a block diagram illustrating a semiconductor device 300 in accordance with a third embodiment of the present invention. FIG. 6 is a truth table for describing an operation of a control signal generation block 310 shown in FIG. 5.

Referring to FIG. 5, the semiconductor device 300 may include a control signal generation block 310, a monitoring block 320, and a counting block 380.

The control signal generation block 310 may activate a first control signal NCTRL or a second control signal PCTRL based on a mode signal PLHN when an enable signal ROD_EN is activated. When the enable signal ROD_EN is deactivated, the control signal generation block 310 may deactivate and output the first control signal NCTRL to a logic high level regardless of the mode signal PLHN. The control signal generation block 310 may deactivate and output the second control signal PCTRL to a logic low level.

Referring to FIG. 6, the mode signal PLHN, which is used for determining whether to monitor a PMOS transistor or an NMOS transistor, may have the logic low level when the PMOS transistor is monitored, while having the logic high level when the NMOS transistor is monitored. In other words, when the mode signal PLHN is inputted with the logic low level while the enable signal ROD_EN is activated, the control signal generation block 310 may activate, and output, the first control signal NCTRL to the logic low level to monitor characteristics of the PMOS transistor. Also, when the mode signal PLHN is inputted with the logic high level while the enable signal ROD_EN is activated, the control signal generation block 310 may activate, and output, the second control signal PCTRL having the logic high level to monitor characteristics of the NMOS transistor. When the monitoring block 320 does not perform a monitoring operation, that is, in a standby mode where the enable signal ROD_EN is deactivated, the control signal generation block 310 may deactivate and output the first control signal NCTRL having the logic high level. The control signal generation block 310 may deactivate, and output, the second control signal PCTRL having the logic low level.

Referring back to FIG. 5, the control signal generation block 310 may include a logic AND gate AND1, an inverter INV1, and a logic OR gate OR1. The logic AND gate AND1 receives and performs an AND operation on the enable signal ROD_EN and the mode signal PLHN to output the second control signal PCTRL. The inverter INV1 inverts the enable signal ROD_EN. The logic OR gate OR1 performs an OR operation on an output of the inverter INV1 and the second control signal PCTRL to output the first control signal NCTRL.

The monitoring block 320 may be embodied in a ring oscillator delay (ROD) for monitoring the characteristics of the PMOS and NMOS transistors. The monitoring block 320 may include a plurality of delay cells 322_1 to 322_K, coupled in series to each other, and a monitoring control unit 324 for controlling the delay cells 322_1 to 322_K to perform the monitoring operation based on the enable signal ROD_EN. The delay cells 322_1 to 322_K may be composed of an even number, that is, K is an even number. The delay cells 322_1 to 322_K constitute a delay chain composed of a plurality of inverters. Each of the delay cells 322_1 to 322_K may include a pull-up transistor PU5 and a pull-down transistor PD5 coupled in series to each other. When the enable signal ROD_EN is activated, the monitoring control unit 324 may invert an output of the delay cell 322_K disposed at a last terminal among the delay cells 322_1 to 322_K, that is, a monitoring signal ROD_OUT, to output an inverted signal to an input terminal IN1 of the delay cell 322_1 disposed at a first terminal. The monitoring control unit 324 may be composed of a logic NAND gate ND5 that performs a NAND operation on the enable signal ROD_EN and the monitoring signal ROD_OUT.

Additionally, the monitoring block 320 may further include a plurality of pull-up coupling units 326_1 to 326_K, and a plurality of pull-down coupling units 328_1 to 328_K. Each of the pull-up coupling units 326_1 to 326_K may be arranged between an input terminal of each of the delay cells 322_1 to 322_K and a gate of the pull-up transistor PU5. Each of the pull-up coupling units 326_1 to 326_K may adjust turn-on extent based on the first control signal NCTRL. Each of the pull-down coupling units 328_1 to 328_K may be arranged between the input terminal of each of the delay cells 322_1 to 322_K and a gate of the pull-down transistor PD5. Each of the pull-down coupling units 328_1 to 328_K may adjust turn-on extent based on the second control signal PCTRL.

The pull-up coupling units 326_1 to 326_K may operate to further increase strength of the pull-up transistor PU5 when the first control signal NCTRL is deactivated as compared to when the first control signal NCTRL is activated. In an embodiment, each of the pull-up coupling units 326_1 to 326_K may be composed of a transmission gate TG3 which is fully turned on when the first control signal NCTRL is deactivated but is slightly turned on when the first control signal NCTRL is activated. The transmission gate TG3 may include a PMOS transistor CP4 and an NMOS transistor CN4. The PMOS transistor CP4 may have one side coupled to the input terminal IN1 of the delay cell 322_1, the other side coupled to the gate of the pull-up transistor PU5 of the delay cell 322_1, and a gate coupled to a ground voltage VSS terminal. The NMOS transistor CN4 may have one side coupled to the input terminal IN1 of the delay cell 322_1, the other side coupled to the gate of the pull-up transistor PU5 of the delay cell 322_1, and a gate receiving the first control signal NCTRL. As described above, the first control signal NCTRL is activated to the logic low level. When the first control signal NCTRL is deactivated, the NMOS transistor CN4 may be turned on.

The pull-down coupling units 328_1 to 328_K may operate to further increase strength of the pull-down transistor PD5 when the second control signal PCTRL is deactivated as compared to when the second control signal PCTRL is activated. In an embodiment, each of the pull-down coupling units 328_1 to 328_K may be composed of a transmission gate TG4 which is fully turned on when the second control signal PCTRL is deactivated and is slightly turned on when the second control signal PCTRL is activated. The transmission gate TG4 may include an NMOS transistor CN5 and a PMOS transistor CP5. The NMOS transistor CN5 may have one side coupled to the input terminal IN1 of the delay cell 322_1, the other side coupled to the gate of the pull-down transistor PD5 of the delay cell 322_1, and a gate coupled to a power source voltage VDD terminal. The PMOS transistor CP5 may have one side coupled to the input terminal IN1 of the delay cell 322_1, the other side coupled to the gate of the pull-down transistor PD5 of the delay cell 322_1, and a gate receiving the second control signal PCTRL.

The counting block 380 may count a toggling number of the monitoring signal ROD_OUT based on a counting enable signal ROD_CNT_EN. The counting block 380 may output a counted toggling number as counting signals ROD_CNT<N−1:0>. The counting signals ROD_CNT<N−1:0> may be activated when the enable signal ROD_EN is activated.

Hereinafter, a monitoring operation of the semiconductor device 300 shown in FIG. 5 will be described with reference to FIG. 7.

FIG. 7 is a timing diagram illustrating an operation of the semiconductor device 300 shown in FIG. 5.

Referring to FIG. 7, when the enable signal ROD_EN has a logic low level, the monitoring control unit 324 may input a signal having a logic high level to the input terminal IN1 of the delay cell 322_1. Accordingly, the delay cells 322_1 to 322_K may output the monitoring signal ROD_OUT fixed with the logic high level.

When the enable signal ROD_EN is activated as the logic high level, the control signal generation block 310 activates the first control signal NCTRL or the second control signal PCTRL based on the mode signal PLHN.

When the mode signal PLHN has the logic low level, the control signal generation block 310 may activate the first control signal NCTRL as the logic low level and deactivate the second control signal PCTRL as the logic low level to monitor the PMOS transistor. The monitoring control unit 324 inverts the monitoring signal ROD_OUT to output an inverted signal to the input terminal IN1 of the delay cell 322_1. The delay cells 322_1 to 322_K may perform a ring oscillation operation to generate the monitoring signal ROD_OUT oscillating at a frequency determined by a process condition P, an operating voltage V and an operating temperature T of the semiconductor device.

At this time, the transmission gate TG3 of the pull-up coupling units 326_1 to 326_K is slightly turned on in response to the first control signal NCTRL, and the transmission gate TG4 of the pull-down coupling units 328_1 to 328_K is fully turned on in response to the second control signal PCTRL. Consequently, strength of the pull-up transistor PU5 of each of the delay cells 322_1 to 322_K may be reduced due to the pull-up coupling units 326_1 to 326_K, and thus a rising edge of the monitoring signal ROD_OUT may have a profile having a slope rather than a vertical profile. In other words, the monitoring block 320 may generate the monitoring signal ROD_OUT which is more influenced by characteristics of the pull-up transistor PU5 than the pull-down transistor PD5.

The counting block 380 counts the toggling number of the monitoring signal ROD_OUT based on the counting enable signal ROD_CNT_EN. The counting block 380 outputs the counted toggling number as the counting signals ROD_CNT<N−1:0>. The counting signals ROD_CNT<N−1:0> may have a counting value that varies according to the characteristics of the pull-up transistor PU5. An external device may change a characteristic of the PMOS transistor arranged in the semiconductor device by monitoring the counting signals ROD_CNT<N−1:0>.

When the mode signal PLHN has the logic high level, the control signal generation block 310 may deactivate the first control signal NCTRL as the logic high level but activate the second control signal PCTRL as the logic high level, to monitor the NMOS transistor. The monitoring control unit 324 inverts the monitoring signal ROD_OUT to output an inverted signal to the input terminal IN1 of the delay cell 322_1. The delay cells 322_1 to 322_K may perform a ring oscillation operation to generate the monitoring signal ROD_OUT oscillating at a frequency determined by a process condition P, an operating voltage V and an operating temperature T of the semiconductor device.

At this time, the transmission gate TG3 of the pull-up coupling units 326_1 to 326_K is slightly turned on in response to the first control signal NCTRL, and the transmission gate TG4 of the pull-down coupling units 328_1 to 328_K is fully turned on in response to the second control signal PCTRL. Consequently, strength of the pull-up transistor PU5 of each of the delay cells 322_1 to 322_K may be reduced due to the pull-up coupling units 326_1 to 326_K. Thus, a rising edge of the monitoring signal ROD_OUT may have a profile having a slope rather than a vertical profile. In other words, the monitoring block 320 may generate the monitoring signal ROD_OUT which is more influenced by characteristics of the pull-up transistor PU5 than the pull-down transistor PD5.

The counting block 380 counts the toggling number of the monitoring signal ROD_OUT based on the counting enable signal ROD_CNT_EN and outputs the counted toggling number as the counting signals ROD_CNT<N−1:0>. The counting signals ROD_CNT<N−1:0> may have a counting value that varies according to the characteristics of the pull-down transistor PD5. The external device, for example, a controller or a test device, may change a size of the NMOS transistor arranged in the semiconductor device by monitoring the counting signals ROD_CNT<N−1:0>.

As described above, in the semiconductor device 200 in accordance with the third embodiment of the present invention, since the pull-up coupling units 326_1 to 326_K and the pull-down coupling units 328_1 to 328_K are fully turned on in the standby mode when the enable signal ROD_EN is deactivated to the logic low level, a leakage current of the monitoring block may be minimized. Also, a circuit for monitoring the characteristics of the PMOS transistor and a circuit for monitoring the characteristics of the NMOS transistor are implemented with the same circuit, whereby a mismatch of the monitoring may be minimized, and only variations in the characteristics of the PMOS transistor or the characteristics of the NMOS transistor may be minutely measured.

As is apparent from the above descriptions, the semiconductor device in accordance with embodiments of the disclosure, advantageously applies to an actual field by blocking a leakage current when a ring oscillator delays (ROD) for monitoring process variations does not perform a monitoring operation.

Furthermore, an influence of a mismatch between a ROD for monitoring a PMOS transistor and a ROD for monitoring an NMOS transistor may be minimized.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

Moreover, dispositions and types of the logic gates and transistors described in the aforementioned embodiments may be implemented differently based on the polarity of the inputted signal.

What is claimed is:

1. A semiconductor device comprising:
a plurality of delay cells coupled in series to each other, each including a pull-up transistor and a pull-down transistor coupled in series to each other;
a monitoring control circuit that controls the delay cells to perform a monitoring operation based on an enable signal; and
a coupling circuit that is turned on to couple each input terminal of the delay cells with a gate of the pull-up transistor or the pull-down transistor, and adjusts a turned-on level thereof based on the enable signal, wherein the coupling circuit includes a transmission gate which is fully turned on when the enable signal is deactivated as compared with when the enable signal is activated.

2. The semiconductor device of claim 1, wherein the coupling circuit further increases strength of the pull-up transistor or pull-down transistor when the enable signal is deactivated as compared with when the enable signal is activated.

3. The semiconductor device of claim 1, wherein the coupling circuit includes:
a first PMOS transistor coupled between each input terminal of the delay cells and the gate of the pull-up transistor, and receiving a ground voltage to a gate; and
a first NMOS transistor coupled between each input terminal of the delay cells and the gate of the pull-up transistor, and receiving an inverted signal of the enable signal to a gate.

4. The semiconductor device of claim 1, wherein the coupling circuit includes:
a second NMOS transistor coupled between each input terminal of the delay cells and the gate of the pull-down transistor, which receives a power source voltage to a gate; and
a second PMOS transistor coupled between each input terminal of the delay cells and the gate of the pull-down transistor, which receives the enable signal to a gate.

5. The semiconductor device of claim 1, wherein the monitoring control circuit inverts an output of a delay cell disposed at a last terminal among the delay cells and provides an inverted signal to an input terminal of a delay cell disposed at a first terminal when the enable signal is activated.

6. A semiconductor device comprising:
a first monitoring circuit that includes a plurality of first delay cells, which are coupled in series to each other, each including a first pull-up transistor and a first pull-down transistor coupled in series to each other, and performs a monitoring operation based on a first enable signal;
a second monitoring circuit that includes a plurality of second delay cells, which are coupled in series to each other, each including a second pull-up transistor and a second pull-down transistor coupled in series to each other, and performs a monitoring operation based on a second enable signal;
a first coupling circuit that is turned on to couple each input terminal of the first delay cells with a gate of the first pull-up transistor, and adjusts a turned-on level thereof based on the first enable signal; and
a second coupling circuit that is turned on to couple each input terminal of the second delay cells with a gate of the second pull-down transistor, and adjusts a turned on level thereof based on the second enable signal,
wherein each of the first and second coupling circuits includes a transmission gate which is fully turned on when the first enable signal is deactivated as compared with when the first enable signal is activated.

7. The semiconductor device of claim 6, wherein the first coupling circuit further increases strength of the first pull-up transistor when the first enable signal is deactivated as compared with when the first enable signal is activated.

8. The semiconductor device of claim 6, wherein the first coupling circuit includes:
a first PMOS transistor coupled between each input terminal of the first delay cells and the gate of the first pull-up transistor, which receives a ground voltage to a gate; and a first NMOS transistor coupled between each input terminal of the first delay cells and the gate of the first pull-up transistor, which receives an inverted signal of the first enable signal to a gate.

9. The semiconductor device of claim 6, wherein the second coupling circuit further increases strength of the second pull-down transistor when the second enable signal is deactivated as compared with when the second enable signal is activated.

10. The semiconductor device of claim 6, wherein the second coupling circuit includes:
a second NMOS transistor coupled between each input terminal of the second delay cells and the gate of the second pull-down transistor, which receives a power source voltage to a gate; and
a second PMOS transistor coupled between each input terminal of the second delay cells and the gate of the second pull-down transistor, which receives the second enable signal to a gate.

11. The semiconductor device of claim 6, wherein the first monitoring circuit includes:
the plurality of first delay cells; and
a monitoring control unit that inverts an output of a delay cell disposed at a last terminal among the first delay cells and provides an inverted signal to an input terminal of a delay cell disposed at a first terminal when the first enable signal is activated.

12. The semiconductor device of claim 6, wherein the second monitoring circuit includes:
the plurality of second delay cells; and
a monitoring control unit that inverts an output of a delay cell disposed at a last terminal among the second delay cells and provides an inverted signal to an input terminal of a delay cell disposed at a first terminal when the second enable signal is activated.

13. A semiconductor device comprising:
a monitoring circuit that includes a plurality of delay cells, which are coupled in series to each other, each including a pull-up transistor and a pull-down transistor coupled in series to each other, and performs a monitoring operation based on an enable signal;
a first coupling circuit that is turned on to couple each input terminal of the delay cells with a gate of the pull-up transistor, and adjusts a turned-on level thereof based on a first control signal;
a second coupling circuit that is turned on to couple each input terminal of the delay cells with a gate of the pull-down transistor, and adjusts a turned-on level thereof based on a second control signal; and
a control signal generation circuit that activates the first control signal or the second control signal based on a mode signal when the enable signal is activated, and deactivates the first control signal or the second control signal when the enable signal is deactivated,
wherein each of the first and second coupling circuits includes a transmission gate which is fully turned on when the first control signal is deactivated as compared with when the first control signal is activated.

14. The semiconductor device of claim 13, wherein the first coupling circuit further increases strength of the pull-up transistor when the first control signal is deactivated as compared with when the first control signal is activated.

15. The semiconductor device of claim 13, wherein the first coupling circuit includes:
a first PMOS transistor coupled between each input terminal of the delay cells and the gate of the pull-up transistor, which receives a ground voltage to a gate; and
a first NMOS transistor coupled between each input terminal of the delay cells and the gate of the pull-up transistor, which receives the first control signal, which is deactivated to a logic high level, to a gate.

16. The semiconductor device of claim 13, wherein the second coupling circuit further increases strength of the pull-down transistor when the second control signal is deactivated as compared with when the second control signal is activated.

17. The semiconductor device of claim 13, wherein the second coupling circuit includes:
a second NMOS transistor coupled between each input terminal of the delay cells and the gate of the pull-down transistor, which receives a power source voltage to a gate; and
a second PMOS transistor coupled between each input terminal of the delay cells and the gate of the pull-down transistor, which receives the second control signal to a gate.

18. The semiconductor device of claim 13, wherein the monitoring circuit includes:
the plurality of delay cells; and
a monitoring control unit that inverts an output of a delay cell disposed at a last terminal among the delay cells and provides an inverted signal to an input terminal of a delay cell disposed at a first terminal when the enable signal is activated.

19. A semiconductor device comprising:
a plurality of delay cells coupled in series to each other, each including a pull-up transistor a pull-down transistor coupled in series to each other;
a monitoring control circuit that controls the delay cells to perform a monitoring operation based on an enable signal; and
a coupling circuit that is turned on to couple, each input terminal of the delay cells with a gate of the pull-up transistor or pull-down transistor, and maintains a turned-on state, wherein the monitoring control circuit inverts an output of a delay cell disposed at a last terminal among the delay cells and provides an inverted signal to an input terminal of a delay cell disposed at a first terminal when the enable signal is activated.

20. The semiconductor device of claim 19, wherein the coupling circuit includes:
a PMOS transistor coupled between each input terminal of the delay cells and the gate of the pull-up transistor, which receives a ground voltage to a gate.

21. The semiconductor device of claim 19, wherein the coupling circuit includes:
an NMOS transistor coupled between each input terminal of the delay cells and the gate of the pull-down transistor, which receives a power source voltage to a gate.

* * * * *